US012451582B2

United States Patent
Seok et al.

(10) Patent No.: US 12,451,582 B2
(45) Date of Patent: Oct. 21, 2025

(54) COUPLER HAVING SPIRAL COUPLING LINE

(71) Applicant: RN2 Technologies Co., Ltd., Hwaseong-si (KR)

(72) Inventors: Chang Heon Seok, Hwaseong-si (KR); Gyung Hoon Baek, Hwaseong-si (KR); Jae Hong Choi, Hwaseong-si (KR); Hyo Jong Lee, Hwaseong-si (KR); Jeom Gug Yook, Hwaseong-si (KR)

(73) Assignee: RN2 Technologies Co., Ltd., Hwaseong-si (KR)

( * ) Notice: Subject to any disclaimer, the term of this patent is extended or adjusted under 35 U.S.C. 154(b) by 231 days.

(21) Appl. No.: 18/346,624

(22) Filed: Jul. 3, 2023

(65) Prior Publication Data
US 2024/0213647 A1    Jun. 27, 2024

(30) Foreign Application Priority Data

Dec. 23, 2022   (KR) ......................... 10-2022-0183398

(51) Int. Cl.
| | |
|---|---|
| *H01P 5/18* | (2006.01) |
| *H03H 1/00* | (2006.01) |
| *H03H 7/01* | (2006.01) |
| *H03H 7/09* | (2006.01) |

(52) U.S. Cl.
CPC ........... *H01P 5/187* (2013.01); *H03H 7/0115* (2013.01); *H03H 2001/0085* (2013.01)

(58) Field of Classification Search
CPC ... H03H 7/09; H03H 2001/0085; H01P 5/187
USPC ......................................... 333/175, 177, 185
See application file for complete search history.

(56) References Cited

U.S. PATENT DOCUMENTS

| | | | |
|---|---|---|---|
| 7,030,713 B2 * | 4/2006 | Ralph | ..................... H01P 5/187 |
| | | | 333/116 |
| 9,698,461 B2 | 7/2017 | Nagai | |
| 2006/0061430 A1 | 3/2006 | Lee et al. | |

FOREIGN PATENT DOCUMENTS

| | | |
|---|---|---|
| CN | 10-5144319 A | 12/2015 |
| KR | 10-2020-0022738 A | 3/2020 |

* cited by examiner

*Primary Examiner* — Rakesh B Patel

(57) ABSTRACT

The present invention relates to a coupler having a spiral coupling line, and may include a coupler body including ground electrodes and port electrodes for power connection to an outside on a lower surface; a first coupling line located inside the coupler body, electrically connected to at least one of the port electrodes, and having a spiral structure as a whole; a second coupling line located inside the coupler body, electrically connected to at least another one of the port electrodes, and having a shape corresponding to the first coupling line; and an internal ground pattern electrically connected to the ground electrodes.

7 Claims, 17 Drawing Sheets

| Frequency (MHz) | Coupling (dB) | Insertion Loss Max.(dB) | Return Loss Min.(dB) |
|---|---|---|---|
| 3300~3800 | 1.9 ± 0.15 | 0.20 | 23 |
| Isolation Min.(dB) | Phase Balance (Degree) | Power Capacity Avg.(W) | Operating Temperature(°C) |
| 21 | 90 ± 4.0 | 60 | −55 ~ 125 |

| Frequency (MHz) | Coupling (dB) | Insertion Loss Max.(dB) | Return Loss Min.(dB) |
|---|---|---|---|
| 3300~3800 | 2.0 ± 0.25 | 0.30 | 20 |
| Isolation Min.(dB) | Phase Balance (Degree) | Power Capacity Avg.(W) | Operating Temperature(°C) |
| 20 | 90 ± 4.0 | 5 | −55 ~ 125 |

COUPLER HAVING SPIRAL COUPLING LINE

CROSS-REFERENCE TO RELATED APPLICATIONS

This application claims priority to and the benefit of Korean Patent Application No. 10-2022-0183398 filed in the Korean Intellectual Property Office on Dec. 23, 2022, the entire contents of which are incorporated herein by reference.

TECHNICAL FIELD

The present invention relates to a coupler, and more specifically, to a coupler having a spiral coupling line.

BACKGROUND ART

In a wireless communication system, a repeater of a base station transmits a data signal with carrying the same on a high output. In this case, a coupler is used to combine, separate, or receive signals with the increased output.

An amount of a degree of coupling of the coupler can be adjusted by a coupling area and a spacing of coupling lines. The coupler may have a configuration in which a length of the coupling line is a wavelength/4 ($\lambda/4$) of a center frequency of a signal, and this configuration is a basic configuration of the coupler. The coupler including the coupling line having the wavelength/4 ($\lambda/4$) length is widely used because the coupler can be easily implemented and easily coupled with another millimeter wave device or microwave device.

FIG. 1 shows a perspective view of a coupler 1 of the related art. Referring to FIG. 1, the coupler 1 has a pair of coupling lines 3 and 4 located inside a coupler body 2. The pair of coupling lines 3 and 4 each have a meander shape, are spaced apart from each other, and have symmetrical shapes.

SUMMARY OF THE INVENTION

However, in the coupler of the related art, since a width and a spacing of the coupling lines are determined in order to realize a required impedance, there are limitations to increasing characteristics of the coupler 1 such as insertion loss. In addition, since the current flowing through adjacent lines 5 and 6 is in opposite directions, electromagnetic interference occurs, and accordingly, there is a risk of deteriorating the characteristics of the coupler 1 such as insertion loss.

The present invention has been made to solve the above-described problems, and an object thereof is to provide a coupler having spiral lines whereby each line interferes with each other to improve electrical performance and a circuit having a wider line width due to a thicker layer-by-layer distance can be configured to thus improve insertion loss of a final product. However, it should be noted that the above object is only illustrative and the scope of the present invention is not limited thereby.

According to an exemplary embodiment of the present invention, a coupler is provided.

The coupler may include a coupler body including, on an upper or lower surface thereof, ground electrodes and port electrodes for power connection to an outside, respectively; a first coupling line located inside the coupler body, electrically connected to at least one of the port electrodes, and having a spiral structure as a whole; a second coupling line located inside the coupler body, electrically connected to at least another one of the port electrodes, and having a shape corresponding to the first coupling line; and an internal ground pattern electrically connected to the ground electrodes.

According to an exemplary embodiment of the present invention, the second coupling line may be located to overlap at least a portion of the first coupling line.

According to an exemplary embodiment of the present invention, the internal ground pattern may include a first internal ground pattern located between the ground electrodes and the first coupling line or between the ground electrodes and the second coupling line.

According to an exemplary embodiment of the present invention, the internal ground pattern may include a second internal ground pattern located between the second coupling lines inside the coupler body.

According to an exemplary embodiment of the present invention, the first coupling line may include a 1-1 line connected to the port electrode; a 1-2 line extending long in a first direction from the 1-1 line; a 1-3 line extending long in a second direction bent at a predetermined angle from the 1-2 line; and a 1-4 line extending long in a third direction bent at a predetermined angle from the 1-3 line.

According to an exemplary embodiment of the present invention, the 1-3 line may be formed to have a thicker width than that of the 1-2 line.

According to an exemplary embodiment of the present invention, the 1-4 line may be formed to have a thicker width than that of the 1-2 line.

According to an exemplary embodiment of the present invention, at least a portion of the internal ground pattern may be formed at a position not overlapping the first coupling line and the second coupling line so as to be able to induce interference between the first coupling line and the second coupling line.

According to an exemplary embodiment of the present invention, the coupler body may further include a first sheet including the ground electrodes and the port electrodes; a second sheet including a first internal ground pattern; a third sheet including the first coupling line; a fourth sheet including the second coupling line; and a fifth sheet including a second internal ground pattern.

According to the exemplary embodiment of the present invention configured as described above, the first coupling line formed in a spiral shape, the second coupling line formed in a shape corresponding to the first coupling line, and the internal ground electrode formed such that the coupling lines effectively interfere with each other make the coupling stronger, so that a thickness of a circuit can be set thick relative to a total thickness of the same coupler. Due to the increased thickness of the circuit, a line width of the applied circuit can be configured wider, thereby improving the insertion loss of the coupler to improve overall electrical performance and minimizing a size. It should be noted that the scope of the present invention is not limited by these effects.

DETAILED DESCRIPTION

Figure 1:
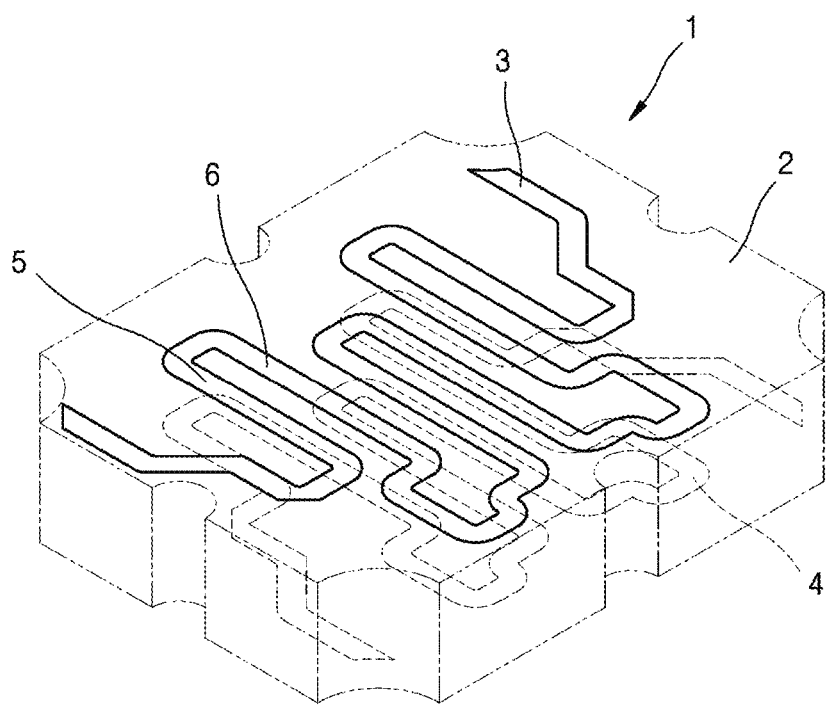
FIG. 1 is a perspective view showing a coupler of the related art.

Hereinafter, several preferred embodiments of the present invention will be described in detail with reference to the accompanying drawings.

The exemplary embodiments of the present invention are provided to more completely explain the present invention to one skilled in the art, the following exemplary embodiments may be modified in many different forms, and the scope of the present invention is not limited to the following exemplary embodiments. Rather, the exemplary embodiments are provided so that the present disclosure will be thoroughly and completely explained and the spirit of the present invention will be completely conveyed to one skilled in the art. In addition, the width or size of each layer in the drawings is exaggerated for convenience and clarity of description.

Hereinafter, the exemplary embodiments of the present invention will be described with reference to the drawings schematically showing ideal embodiments of the present invention. In the drawings, variations of the illustrated shapes may be expected because of, for example, manufacturing techniques and/or tolerances. Therefore, the exemplary embodiments of concepts of the present invention should not be construed as being limited to the specific shapes of regions illustrated herein but should include, for example, changes in shape that result, for example, from manufacturing processes.

Figure 2:
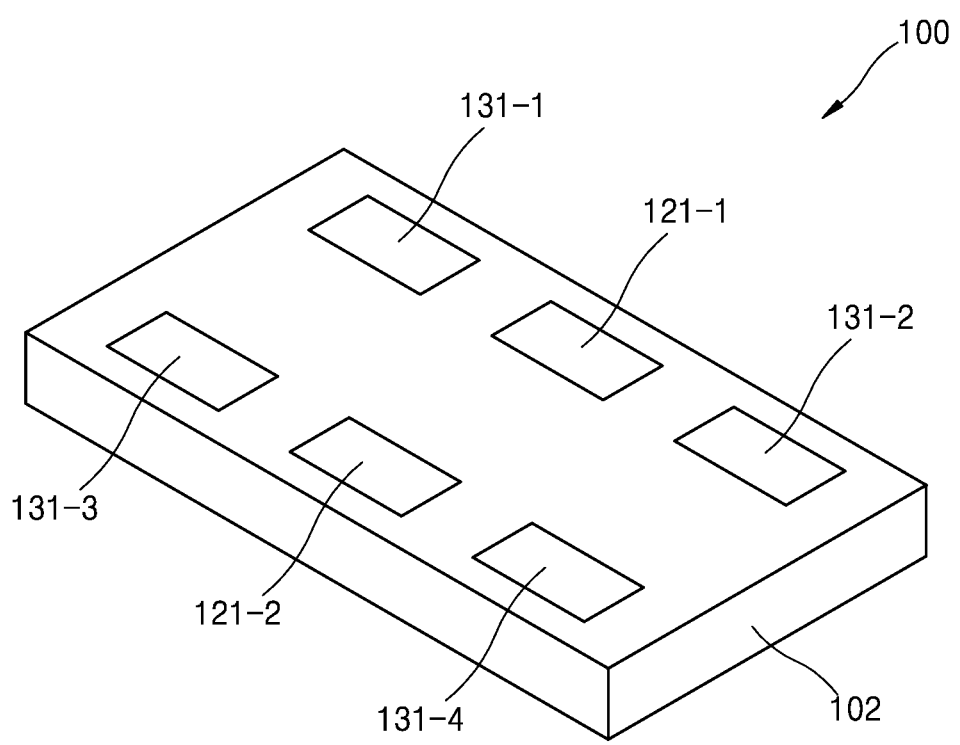
FIG. 2 is a perspective view schematically showing a rear structure of a coupler body according to an exemplary embodiment of the present invention, seen from the bottom.
Figure 17:
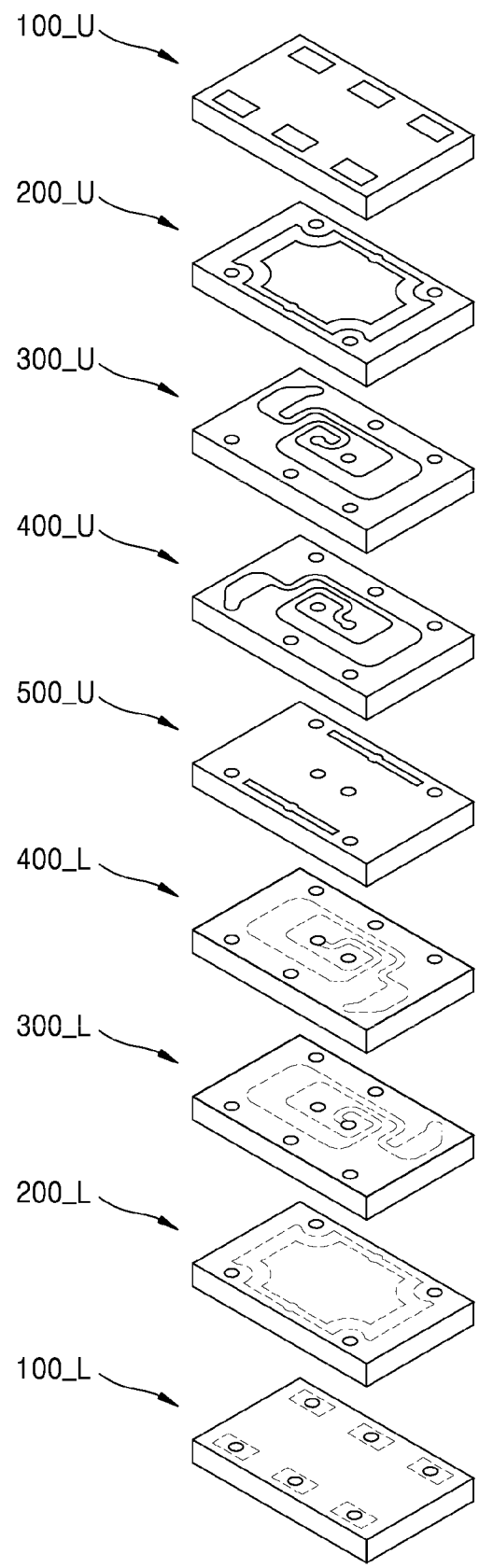
FIG. 17 is an exploded perspective view of a coupler according to an exemplary embodiment of the present invention.

FIG. 2 is a perspective view of a rear surface of a coupler body 10 according to an embodiment of the present invention, seen from the bottom, showing a structure of a rear surface of a lower-side first sheet 100_L of FIG. 17.

Referring to FIG. 2, the coupler body 10 may be configured by a rectangular parallelepiped or regular hexahedral ceramic dielectric, and is formed on its rear surface with a plurality of port electrodes 131-1, 131-2, 131-3 and 131-4 and a plurality of ground electrodes 121-1 and 121-2. On the other hand, referring to an upper-side first sheet 100_U of FIG. 17, the port electrodes and the ground electrodes may not be formed on an upper surface of the coupler body 10.

In the present specification, "upper" and "lower" represent a relative positional relationship, not an absolute positional relationship, and are defined such that the upper-side first sheet 100_U is arranged in the upper direction on the basis of the lower-side first sheet 100_L in the coupler body 10.

As described later, the coupler body 10 may be formed by combining a plurality of sheets, and may be formed by a low temperature co-fired ceramic (LTCC) process. The low-temperature co-fired ceramic process is a technology of making a material made of a mixture of, mainly, glass and ceramic into a form called green sheet (ceramic tape) thinner than paper, cutting the green sheet into several pieces, forming metal conductors such as gold, silver and copper on each green sheet to fit the role of a simple electrode or element, applying each green sheet according to a shape to be configured, and simultaneously baking fired ceramics and metals to form the shape. The plurality of sheets will be described in detail below with reference to FIGS. 3 to 16.

Figure 3:
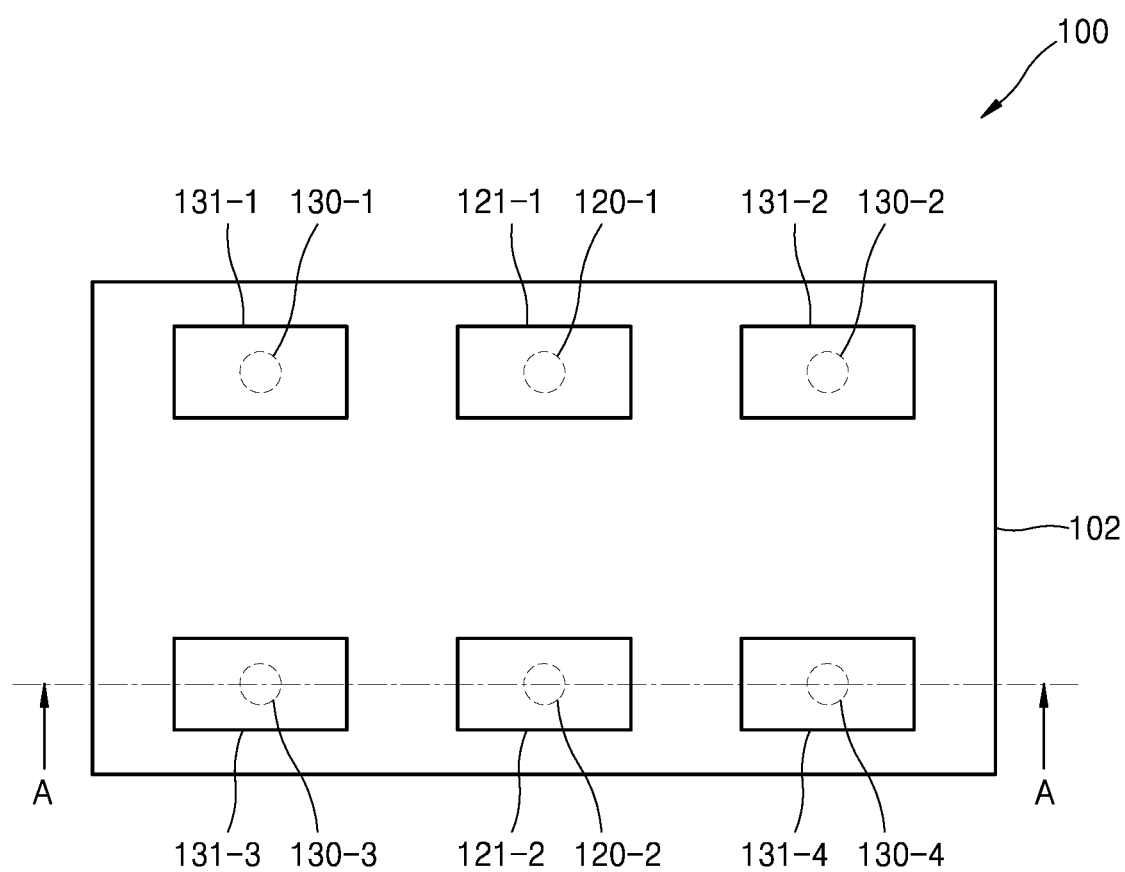
FIG. 3 is a plan view showing an upper surface of a first sheet according to an exemplary embodiment of the present invention.
Figure 4:
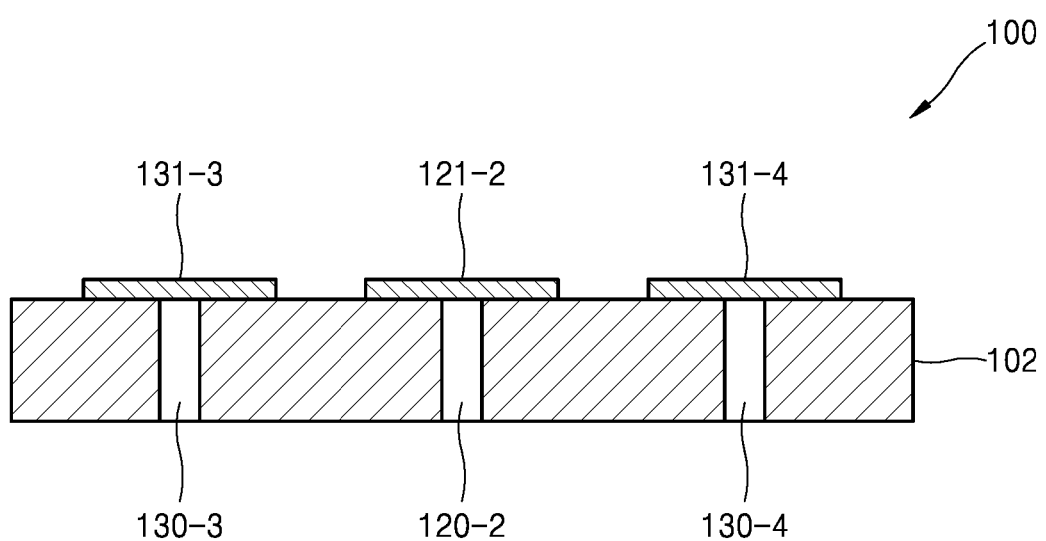
FIG. 4 is a cross-sectional view of the first sheet taken along an A-A line in FIG. 3.

As shown in FIGS. 3 and 4, a first sheet 100 may include a plurality of port via holes 130-1, 130-2, 130-3 and 130-4, a plurality of ground via holes 120-1 and 120-2, a plurality of port electrodes 131-1, 131-2, 131-3 and 131-4, and a plurality of ground electrodes 121-1 and 121-2, which are formed on a first base part 102. The first base part 102 may include an insulating material, and may include, for example, a ceramic material.

The port electrodes 131-1, 131-2, 131-3 and 131-4 and the ground electrodes 121-1 and 121-2 may include a conductive material, and may be formed by applying a conductive paste, for example. In addition, the port electrodes 131-1, 131-2, 131-3 and 131-4 and the ground electrodes 121-1 and 121-2 may be formed by forming the coupler body 10 by the LTCC process and then applying a conductive material to the coupler body 10.

The plurality of port electrodes 131-1, 131-2, 131-3 and 131-4 and the plurality of ground electrodes 121-1 and 121-2 may be formed on the upper surface of the coupler body 10. For example, the plurality of port via holes 130-1, 130-2, 130-3 and 130-4 may be formed at corners of the first sheet 100, respectively, and the plurality of port electrodes 131-1, 131-2, 131-3 and 131-4 may be formed at positions corresponding to the plurality of port via holes 130-1, 130-2, 130-3 and 130-4.

The plurality of ground via holes 120-1 and 120-2 may be formed between the plurality of port via holes 130-1, 130-2, 130-3 and 130-4. For example, the 1-1 ground via hole 120-1 may be formed between the 1-1 port via hole 130-1 and the 1-2 port via hole 130-2, and the 1-2 ground via hole 120-2 may be formed between the 1-3 port via hole 130-3 and the 1-4 port via hole 130-4. The plurality of ground electrodes 121-1 and 121-2 may be formed at positions corresponding to the plurality of ground via holes 120-1 and 120-2.

The plurality of port electrodes 131-1, 131-2, 131-3 and 131-4 and the plurality of ground electrodes 121-1 and 121-2 may also be formed on the lower surface of the coupler 10. Depending on the purpose of use, it is also possible that the plurality of port electrodes 131-1, 131-2, 131-3 and 131-4 and the plurality of ground electrodes 121-1 and 121-2 are provided only on the upper surface of the coupler body 10.

Figure 5:
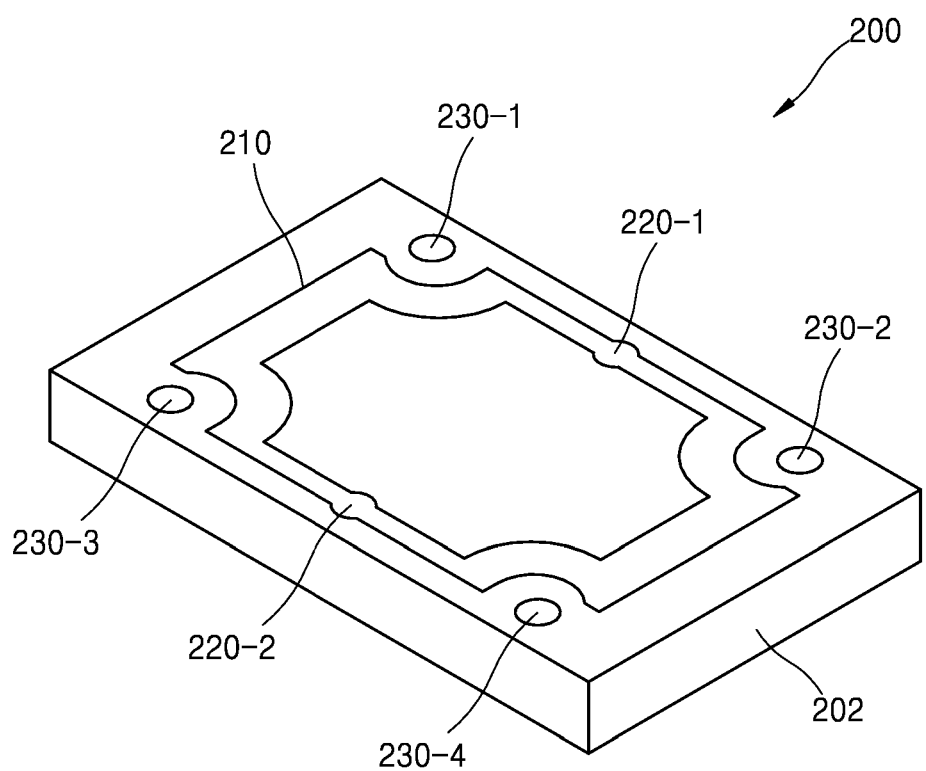
FIG. 5 is a perspective view schematically showing a second sheet according to an exemplary embodiment of the present invention.
Figure 6:
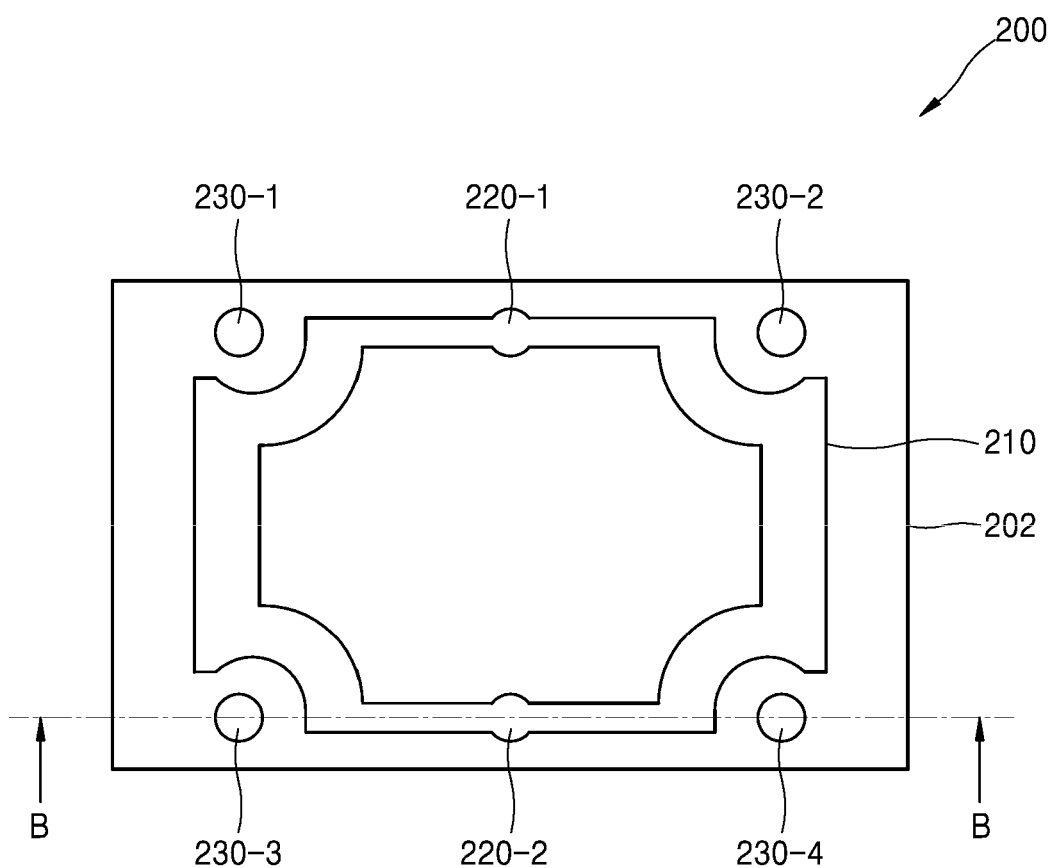
FIG. 6 is a plan view showing an upper surface of the second sheet according to an exemplary embodiment of the present invention.
Figure 7:
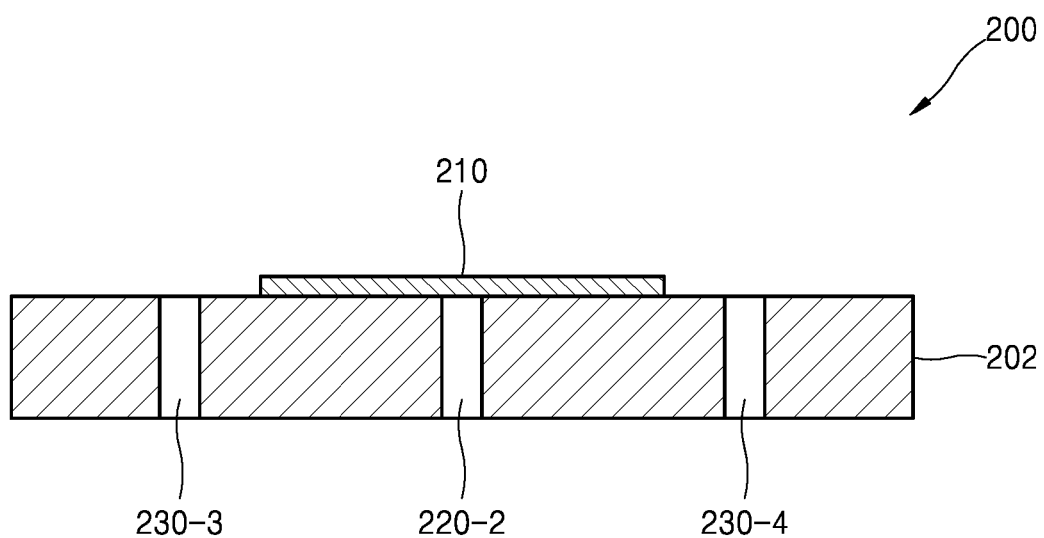
FIG. 7 is a cross-sectional view of the second sheet taken along a B-B line in FIG. 6.

As shown in FIGS. 5 to 7, a second sheet 200 may include a plurality of port via holes 230-1, 230-2, 230-3 and 230-4, a plurality of ground via holes 220-1 and 220-2, and a first ground pattern 210, which are formed on a second base part 202 The second base part 202 may include an insulating material, and may include, for example, a ceramic material. The first ground pattern 210 may include a conductive material, and may be formed by, for example, a deposition method, attaching a conductive sheet, or applying a conductive paste.

Referring to FIG. 6, the first ground pattern 210 may be formed in a symmetrical shape as a whole. For example, the first ground pattern 210 may be formed symmetrically from side to side or from top to bottom with respect to a center of the second base part 202 having a rectangular shape.

In addition, the first ground pattern 210 may be formed at a position not overlapping a first coupling line and a second coupling line so as to be able to induce interference between the first coupling line and the second coupling line, which will be described later. For example, as shown in FIG. 6, the first ground pattern 210 may be formed in a rectangular shape with an empty center, as a whole. In this case, the first ground pattern 210 may include a rounded section at least at a portion so as not to be electrically or physically connected to the port via holes 230-1, 230-2, 230-3 and 230-4.

The first ground pattern 210 may be electrically or physically connected to at least one of the plurality of ground via holes 220-1 and 220-2. For example, the first ground pattern 210 may be electrically or physically connected to the 2-1 ground via hole 220-1 and the 2-2 ground via hole 220-2 located opposite to each other.

The plurality of port via holes 230-1, 230-2, 230-3 and 230-4 and the plurality of ground via holes 220-1 and 220-2 formed on the second base part 202 may be electrically or physically connected to the plurality of port via holes 130-1, 130-2, 130-3 and 130-4 and the plurality of ground via holes 120-1 and 120-2 formed on the first base part 102, respectively.

As a more specific example, as shown in FIG. 6, an edge portion on one side of the first ground pattern 210 formed in a rectangular shape with an empty center as a whole may be formed to have such a length that the edge portion is electrically or physically connected to the 2-1 ground via hole 220-1 but is not electrically or physically connected to the 2-1 port via hole 230-1 and the 2-2 port via hole 230-2.

In addition, an edge portion on other side of the first ground pattern 210 may be formed to have such a length that the edge portion is not electrically or physically connected to the 2-1 port via hole 230-1 and the 2-3 port via hole 230-3, and the edge portion on one side and the edge portion on the other side are connected so that the edge portion on the other side is also electrically or physically connected to the ground via holes 220-1 and 220-2. Further, corner portions of the first ground pattern 210 may be formed in a shape rounded toward the center so as not to be connected to the port via holes 130-1, 130-2, 130-3 and 130-4.

Figure 8:
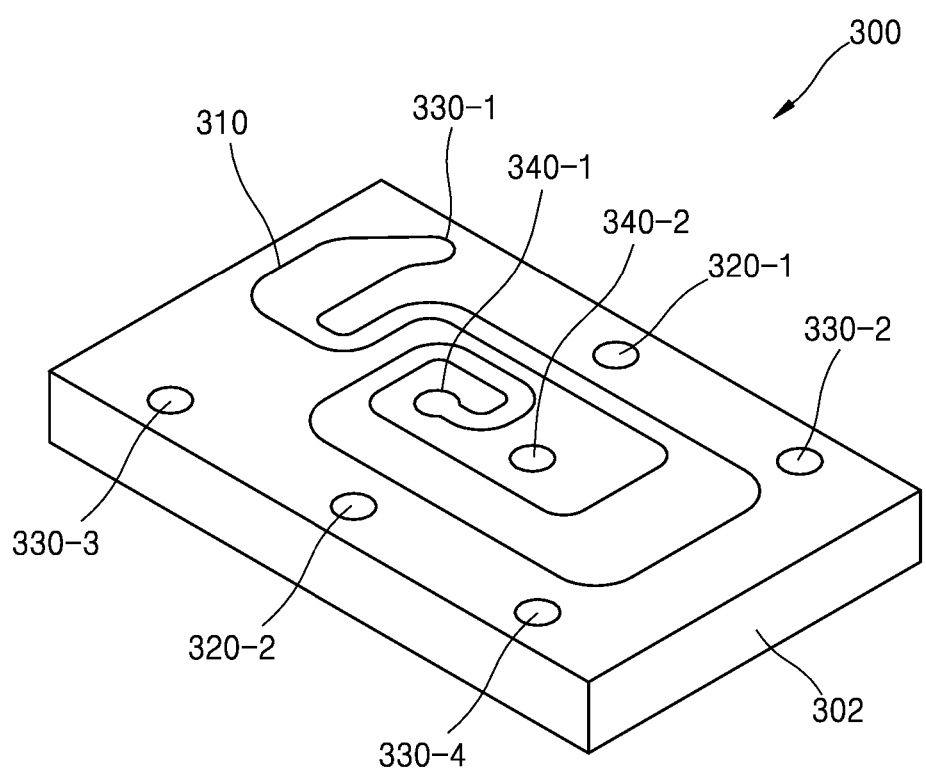
FIG. 8 is a perspective view schematically showing a third sheet according to an exemplary embodiment of the present invention.
Figure 9:
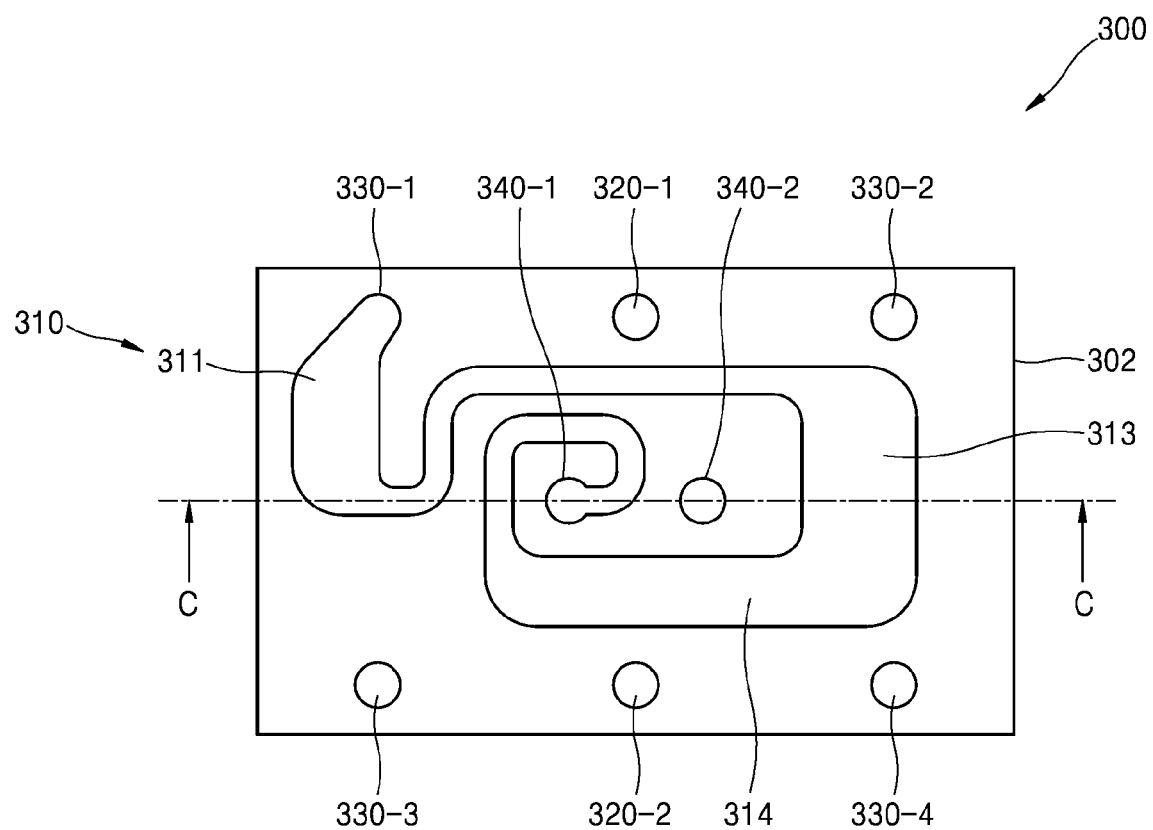
FIG. 9 is a plan view showing an upper surface of the third sheet according to an embodiment of the present invention.
Figure 10:
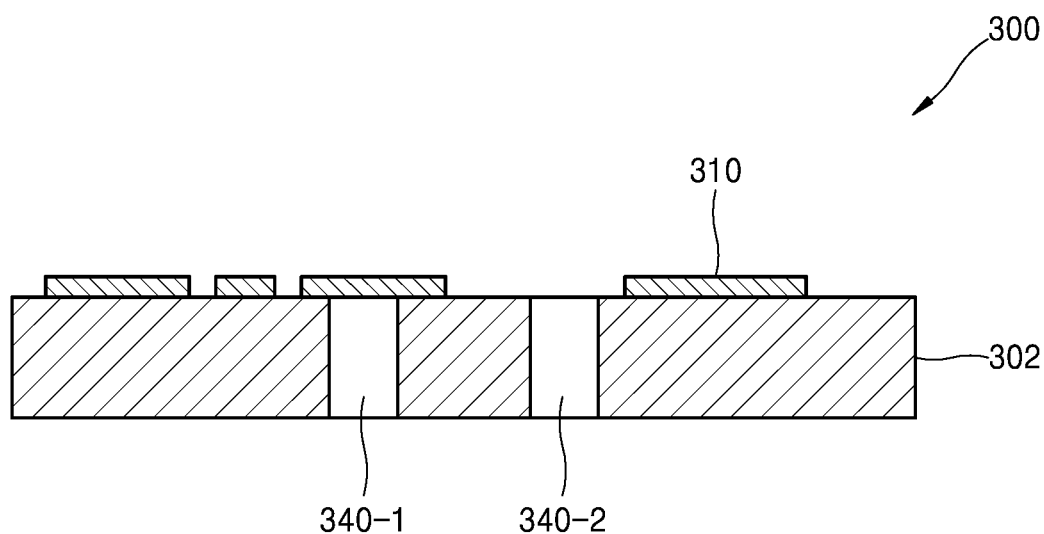
FIG. 10 is a cross-sectional view of the third sheet taken along a C-C line in FIG. 9.

As shown in FIGS. 8 to 10, a third sheet 300 may include a plurality of port via holes 330-1, 330-2, 330-3 and 330-4, a plurality of ground via holes 320-1 and 320-2 a plurality of internal via holes 340-1 and 340-2, and a first coupling line 310, which are formed on a third base part 302. The third base part 302 may include an insulating material, and may include, for example, a ceramic material. The first coupling line 310 may include a conductive material, and may be formed by, for example, a deposition method, attaching a conductive sheet, or applying a conductive paste.

Referring to FIG. 9, the first coupling line 310 may be electrically or physically connected to any one via hole of the plurality of port via holes 330-1, 330-2, 330-3 and 330-4. For example, one side of the first coupling line 310 may be electrically or physically connected to the 3-1 port via hole 330-1, and other side of the first coupling line 310 may be electrically or physically connected to the 1-1 internal via hole 340-1.

The first coupling line 310 may have a spiral structure as a whole. More specifically, the first coupling line 310 may include a 1-1 line 311 connected to the port electrode, a 1-2 line 312 extending long in a first direction from the 1-1 line 311, a 1-3 line 313 extending long in a second direction bent at a predetermined angle from the 1-2 line 312, and a 1-4 line 314 extending long in a third direction bent at a predetermined angle from the 1-3 line 313. Therefore, the first coupling line 310 may have a spiral structure wound in a clockwise direction as a whole.

In this case, the 1-3 line 313 and the 1-4 line 314 may be formed to have a thicker width than that of the 1-2 line 312. In addition, the 1-2 line 312 and the 1-4 line 314 may be formed in an empty space inside the first ground pattern 210 so as to be able to induce effective interference with a second coupling line described later. In the present specification, although the first coupling line 310 is shown as a shape rolled in a clockwise direction as a whole, it is also possible to form the first coupling line in a shape rolled in a counterclockwise direction.

More specifically, the 1-1 line 311 and the 1-3 line 313 of the first coupling line 310 may be formed at positions overlapping the edge portions of the first ground pattern 210 formed on the second sheet 200, and the 1-2 line 312 and the 1-4 line 314 may be formed at positions not overlapping the edge portions of the first ground pattern 210.

As a result of repetitive experiments, it was confirmed that the 1-3 line 313 and the 1-4 line 314 were preferably formed to have a thicker width within a range of 100% to 350% of the width of the 1-2 line 312 and the performance deteriorated when the width exceeded 400%.

The plurality of port via holes 330-1, 330-2, 330-3 and 330-4 and the plurality of ground via holes 320-1 and 320-2 formed on the third base part 302 may be electrically or physically connected to the plurality of port via holes 230-1, 230-2, 230-3 and 230-4 and the plurality of ground via holes 220-1 and 220-2 formed on the second base part 202, respectively.

Figure 11:
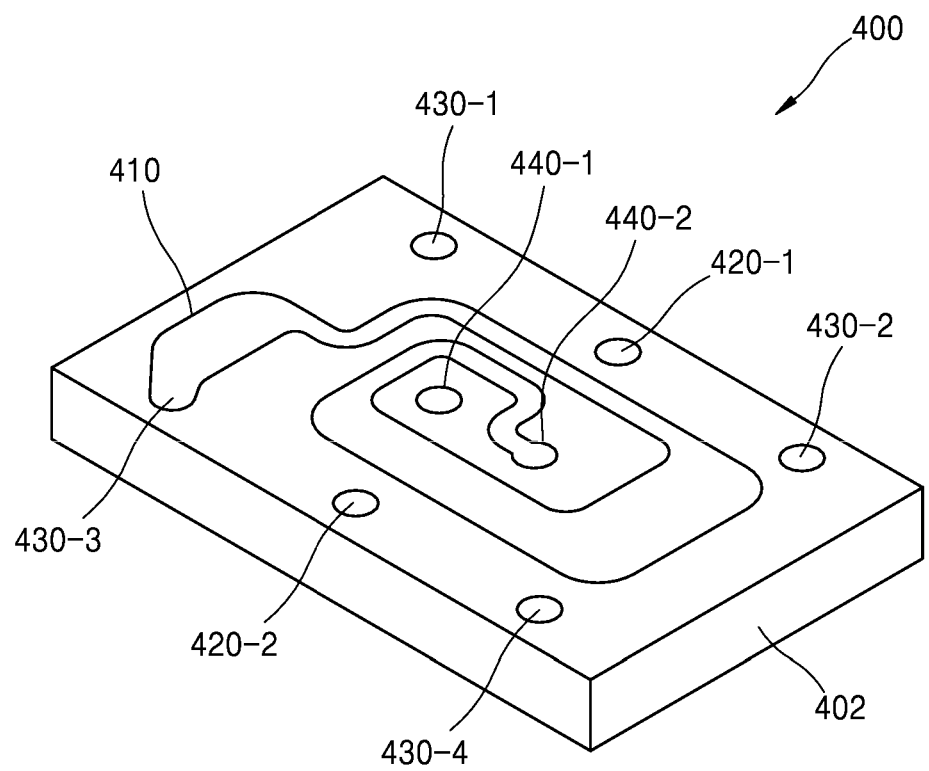
FIG. 11 is a perspective view schematically showing a fourth sheet according to an exemplary embodiment of the present invention.
Figure 12:
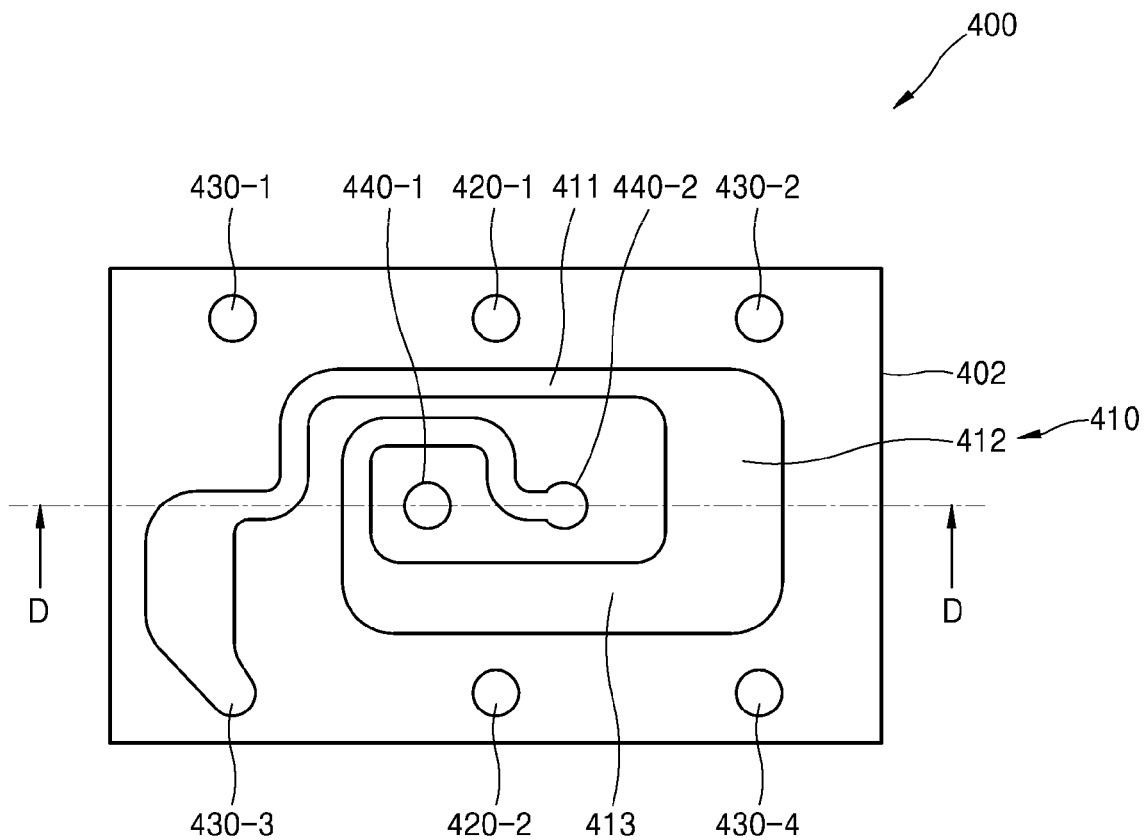
FIG. 12 is a plan view showing an upper surface of the fourth sheet according to an embodiment of the present invention.
Figure 13:
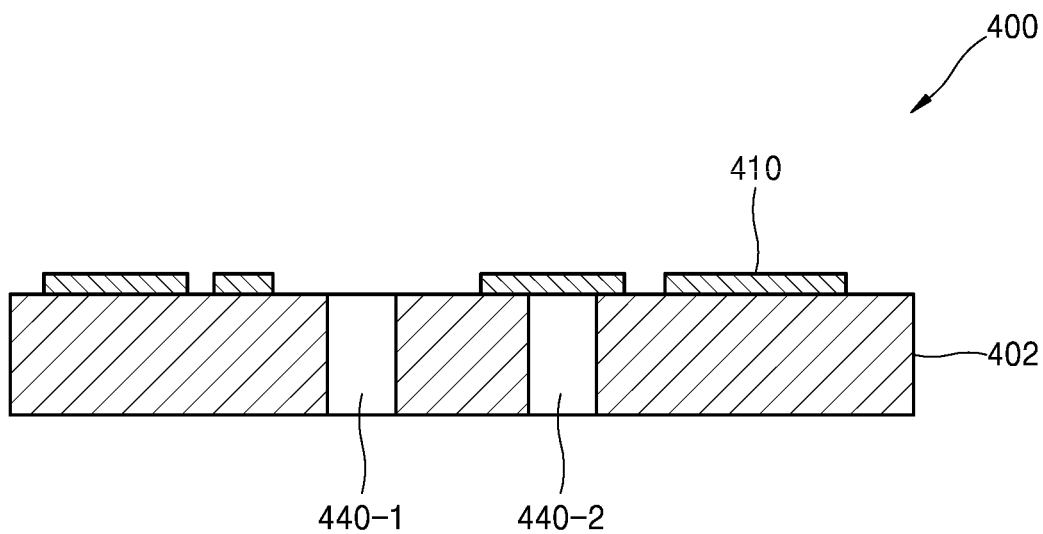
FIG. 13 is a cross-sectional view of the fourth sheet taken along a D-D line in FIG. 12.

As shown in FIGS. 11 to 13, a fourth sheet 400 may include a plurality of port via holes 430-1, 430-2, 430-3 and 430-4, a plurality of ground via holes 420-1 and 420-2 a plurality of internal via holes 440-1 and 440-2, and a second coupling line 410, which are formed on a fourth base part 402. The fourth base part 402 may include an insulating material, and may include, for example, a ceramic material. The second coupling line 410 may include a conductive material, and may be formed by, for example, a deposition method, attaching a conductive sheet, or applying a conductive paste.

Referring to FIG. 12, the second coupling line 410 may be electrically or physically connected to any one via hole of the plurality of port via holes 430-1, 430-2, 430-3 and 430-4. For example, one side of the second coupling line 410 may be electrically or physically connected to the 4-3 port via hole 430-1, and other side of the second coupling line 410 may be electrically or physically connected to the 2-2 internal via hole 440-2.

The second coupling line 410 may have a spiral structure as a whole. More specifically, the second coupling line 410 may include a 2-1 line 411 connected to the port electrode, a 2-2 line 412 extending long in a fourth direction from the 2-1 line 411, a 2-3 line 413 extending long in a fifth direction bent at a predetermined angle from the 2-2 line 412, and a 2-4 line 414 extending long in a sixth direction bent at a predetermined angle from the 2-3 line 413. Therefore, the second coupling line 410 may have a spiral structure wound in a clockwise direction as a whole. In this case, the second coupling line 410 may be formed in a shape corresponding to the first coupling line 310 so as to be able to induce effective interference with the first coupling line 310.

The plurality of port via holes 430-1, 430-2, 430-3 and 430-4, the plurality of ground via holes 420-1 and 420-2 and the plurality of internal via holes 440-1 and 440-2 formed on the fourth base part 402 may be electrically or physically connected to the plurality of port via holes 330-1, 330-2, 330-3 and 330-4, the plurality of ground via holes 320-1 and 320-2 and the plurality of internal via holes 340-1 and 340-2 formed on the third base part 302, respectively.

Figure 14:
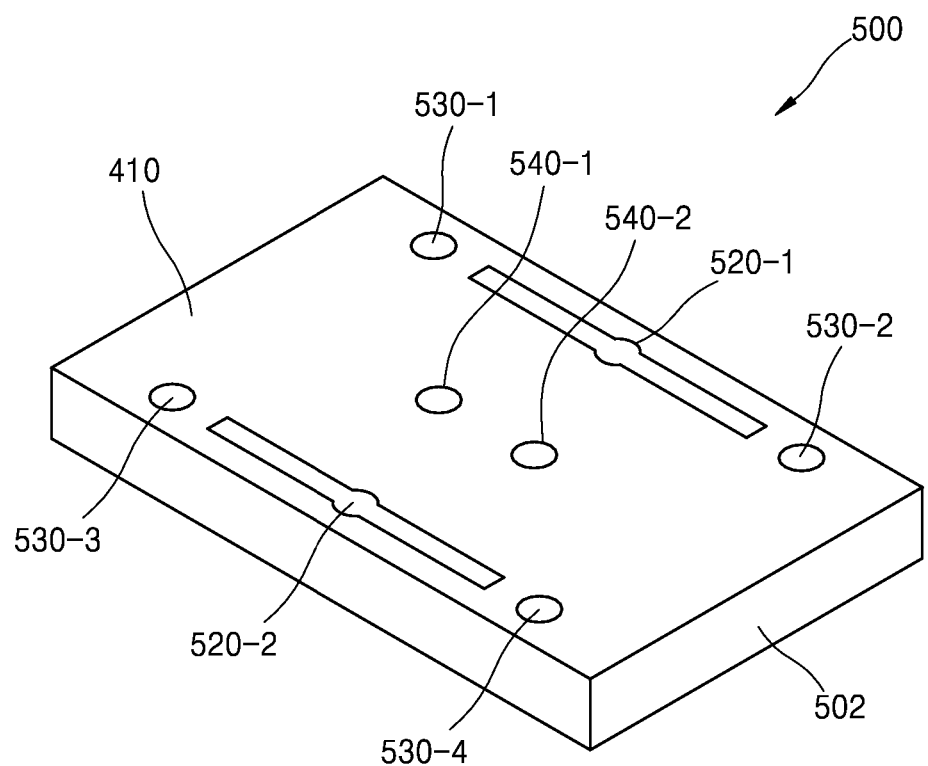
FIG. 14 is a perspective view schematically showing a fifth sheet according to an exemplary embodiment of the present invention.
Figure 15:
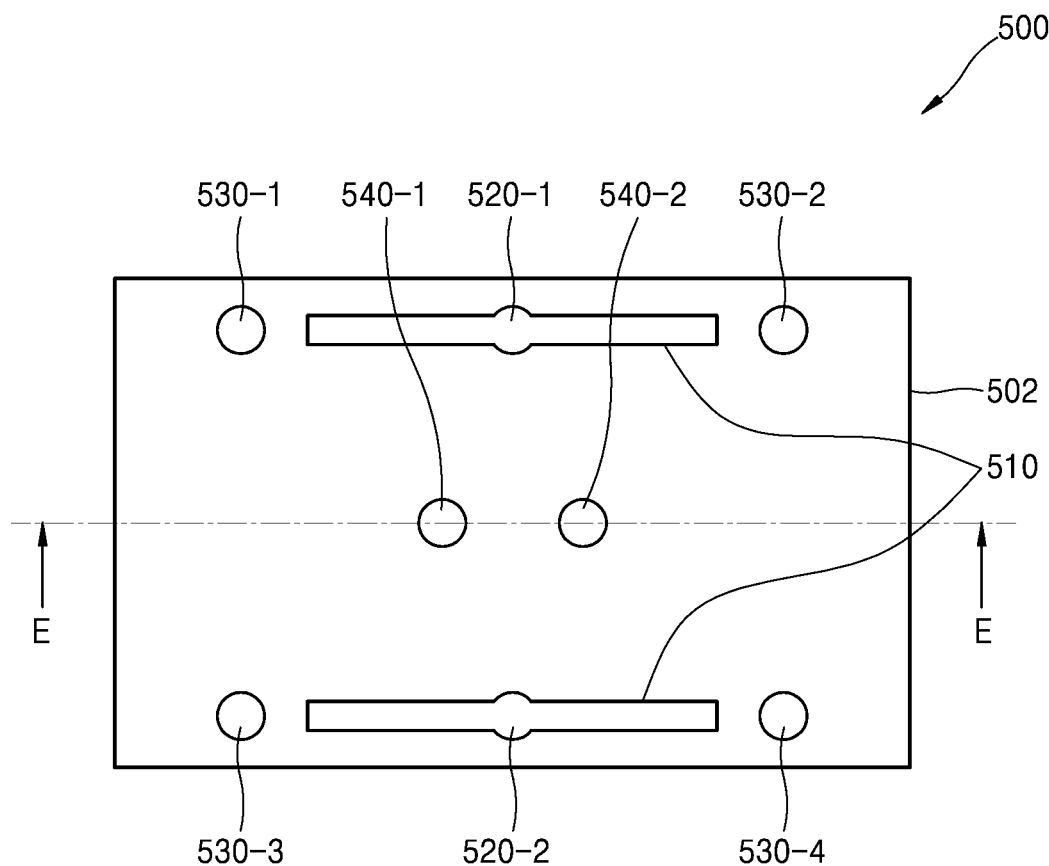
FIG. 15 is a plan view showing an upper surface of the fifth sheet according to an embodiment of the present invention.
Figure 16:
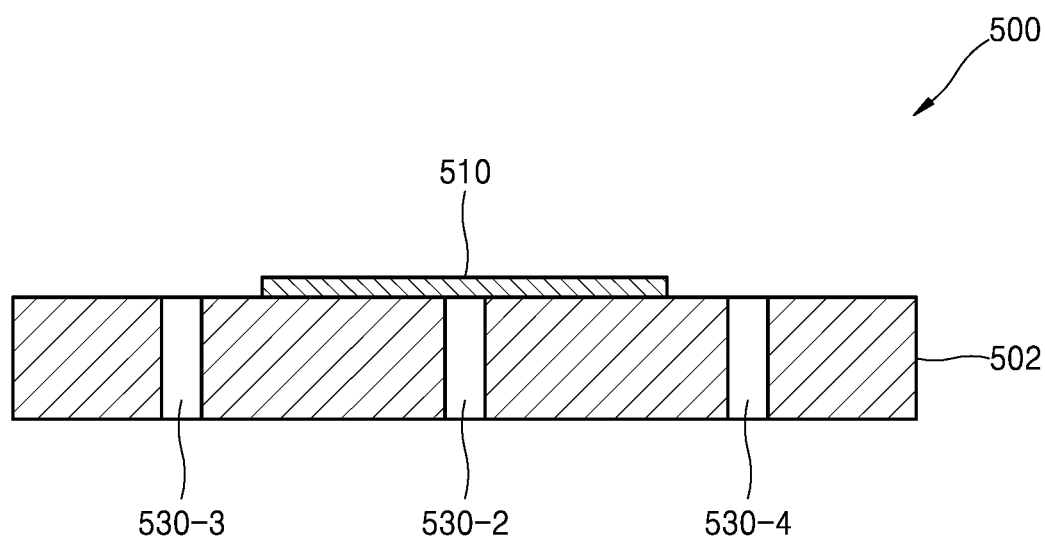
FIG. 16 is a cross-sectional view of the fifth sheet taken along an E-E line in FIG. 15.

As shown in FIGS. 14 to 16, a fifth sheet 500 may include a plurality of port via holes 530-1, 530-2, 530-3 and 530-4, a plurality of ground via holes 520-1 and 520-2, a plurality of internal via holes 540-1 and 540-2, and a second ground pattern 510, which are formed on a fifth base part 502. The fifth base part 502 may include an insulating material, and may include, for example, a ceramic material. The second ground pattern 510 may include a conductive material, and may be formed by, for example, a deposition method, attaching a conductive sheet, or applying a conductive paste.

Referring to FIG. 15, the second ground pattern 510 may be formed in a symmetrical shape as a whole. For example, the second ground pattern 510 may be formed symmetrically from top to bottom with respect to a center of the fifth base part 502 having a rectangular shape.

In addition, the second ground pattern 510 may be formed at a position not overlapping the first coupling line and the second coupling line so as to be able to induce interference between the coupling lines formed on the upper sheets and the coupling lines formed on the lower sheets. For example, as shown in FIG. 15, the second ground pattern 510 may be formed along a periphery of the fifth base part 502 to have a bar shape as a whole.

As a more specific example, as shown in FIG. 15, the second ground pattern 510 may be formed to have such a length that the second ground pattern is electrically or physically connected to the 5-1 ground via hole 520-1, but is not electrically or physically connected to the 5-1 port via hole 530-1 and the 5-2 port via hole 530-2.

The second ground pattern 510 may be electrically or physically connected to at least one of the plurality of ground via holes 520-1 and 520-2. For example, the second ground pattern 510 may be electrically or physically connected to the 5-1 ground via hole 520-1 and the 5-2 ground via hole 520-2 located opposite to each other.

In this case, the second ground pattern 510 may be formed to have such a length that the second ground pattern is not electrically or physically connected to the port via holes 530-1, 530-2, 530-3 and 530-4. In addition, a width of the second ground pattern 510 may be formed to correspond to the width of the first ground pattern 210 so as to be able to induce effective interference between coupling lines.

The plurality of port via holes 530-1, 530-2, 530-3 and 530-4, the plurality of ground via holes 520-1 and 520-2 and the plurality of internal via holes 540-1 and 540-2 formed on the fifth base part 502 may be electrically or physically connected to the plurality of port via holes 430-1, 430-2, 430-3 and 430-4, the plurality of ground via holes 420-1 and 420-2 and the plurality of internal via holes 440-1 and 440-2 formed on the fourth base part 402, respectively.

Referring to FIG. 17, the coupler 10 is formed by stacking the first to fifth sheets 100, 200, 300, 400 and 500. Specifically, from the lower side of the coupler 10, a lower-side first sheet 100_L, a lower-side second sheet 200_L, a lower-side third sheet 300_L, a lower-side fourth sheet 400_L, the fifth sheet 500, an upper-side fourth sheet 400_U, an upper-side third sheet 300_U, an upper-side second sheet 200_U, and an upper-side first sheet 100_U may be stacked. The coupler 10 may be formed using the LTCC process as described above. The lower-side sheets may be stacked in such a form that the upper-side sheets are turned over.

In this case, the upper-side third sheet 300_U and the lower-side fourth sheet 400_L may be electrically or physically connected through the 3-1 internal via hole 340-1, the 4-1 internal via hole 440-1, the 5-1 internal via hole 540-1 and the 4-2 internal via hole 440-2.

In addition, the upper-side fourth sheet 400_U and the lower-side third sheet 300_L may be electrically or physically connected through the 4-2 internal via hole 440-2, the 5-2 internal via hole 540-2, the 4-1 internal via hole 440-1 and the 3-1 internal via hole 340-1.

As shown in FIG. 17, in the coupler body 10 according to an exemplary embodiment of the present invention, the plurality of port via holes 130-1, 130-2, 130-3 and 130-4, the plurality of ground via holes 120-1 and 120-2, the plurality of port electrodes 131-1, 131-2, 131-3 and 131-4, and the plurality of ground electrodes 121-1 and 121-2 may be formed on a lower surface of the lower-side first sheet 100_L, and they may not be formed on the upper-side first sheet 100_U.

Figure 18:
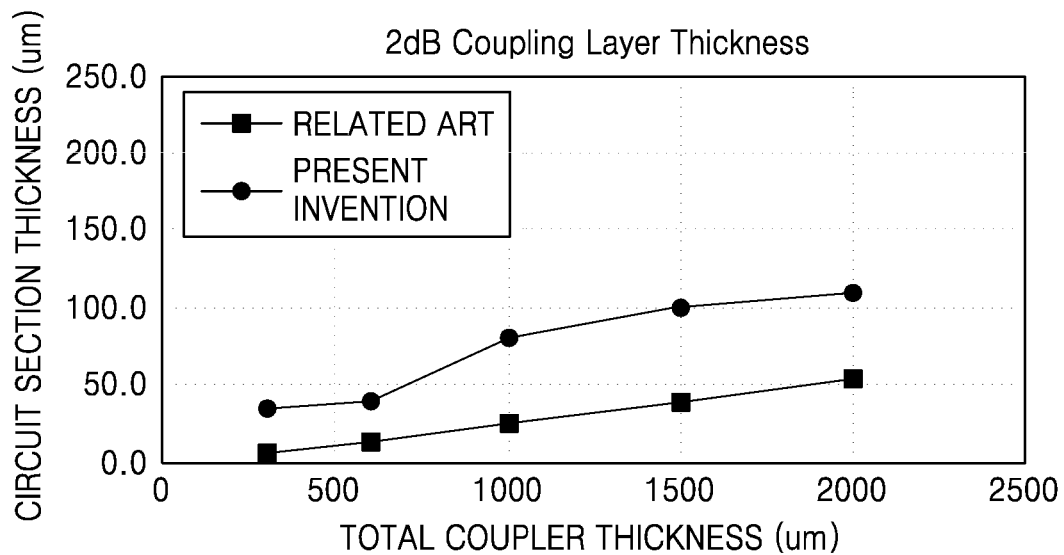
FIG. 18, FIG. 19, FIG. 20, FIG. 21, FIG. 22, and FIG. 23 are tables and graphs comparing a coupler according to an embodiment of the present invention and a coupler of the related art.

Referring to FIG. 18, when comparing a coupler of the related art and a coupler according to an exemplary embodiment of the present invention, the coupler of the present invention had stronger coupling due to interference between the coupling lines, so that the thickness of the circuit could be set thick relative to a total thickness of the same coupler.

Figure 19:
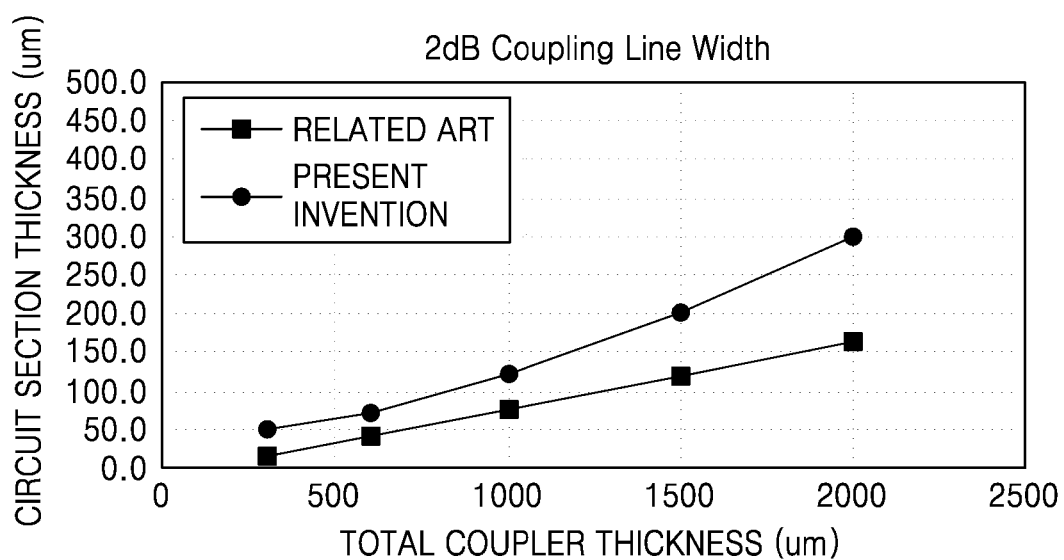

Accordingly, referring to FIG. 19, compared to the coupler of the related art, according to the coupler of the present invention, it can be seen that due to the increased thickness of the circuit, a line width of the applied circuit can be configured wider, thereby improving the insertion loss of the coupler to improve overall electrical performance.

Figures 20, 21:
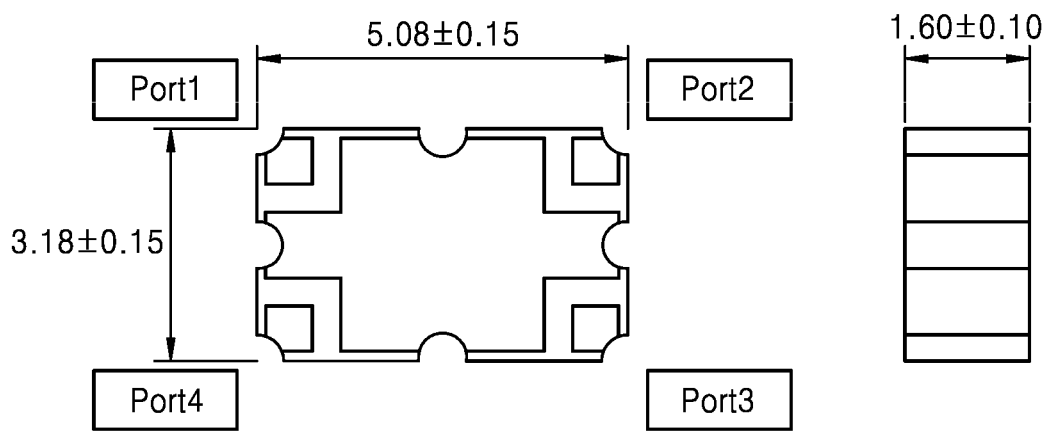

FIG. 20 shows schematic dimensions of a coupler of the related art, and FIG. 21 is a table showing performance of the coupler of the related art. Referring to FIGS. 20 and 21, the coupler of the related art had dimensions of 5.08 (mm) in width and 3.18 (mm) in length, and exhibited the insertion loss of 2.0 and the coupling performance of 1.9.

Figures 22, 23:
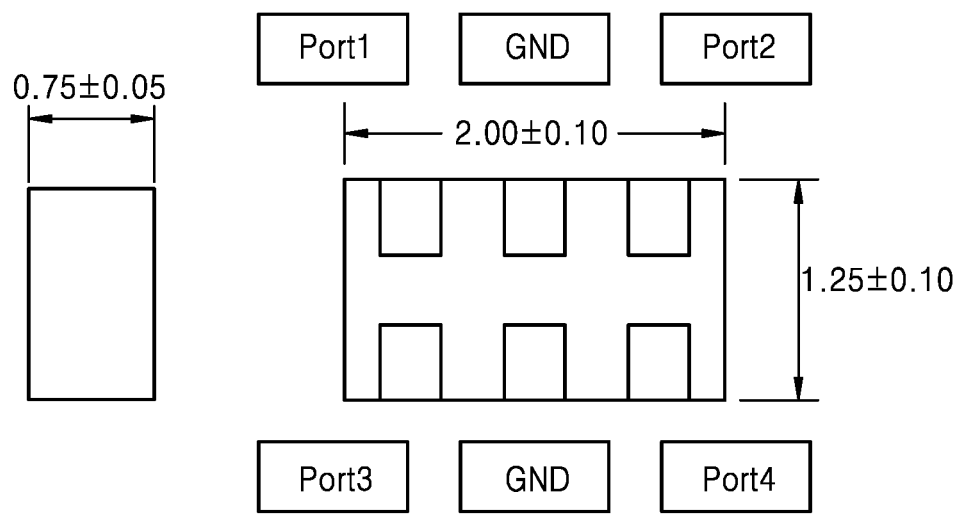

On the other hand, the coupler according to an exemplary embodiment of the present invention shown in FIGS. 22 and 23 had dimensions of 2.00 (mm) in width and 1.25 (mm) in length, which were smaller than the coupler of the related art by about 84.5%, but exhibited the insertion loss of 2.0 and the coupling performance of 2.0.

While the present invention has been described with reference to the embodiments shown in the drawings, the embodiments are only illustrative, and one skilled in the art will understand that various modifications and equivalent embodiments can be made from the embodiments. Therefore, the true technical protection scope of the present invention should be determined by the technical spirit of the attached claims.

What is claimed is:

1. A coupler comprising:
   a coupler body comprising ground electrodes and port electrodes for power connection to an outside on a lower surface;
   a first coupling line located inside the coupler body, electrically connected to at least one of the port electrodes, and having a spiral structure as a whole;
   a second coupling line located inside the coupler body, electrically connected to at least another one of the port electrodes, and having a shape corresponding to the first coupling line; and
   an internal ground pattern electrically connected to the ground electrodes,
   wherein the first coupling line comprises:
   a 1-1 line connected to the port electrode;
   a 1-2 line extending long in a first direction from the 1-1 line;
   a 1-3 line extending long in a second direction bent at a predetermined angle from the 1-2 line; and
   a 1-4 line extending long in a third direction bent at a predetermined angle from the 1-3 line,
   wherein the 1-3 line is formed to have a thicker width than that of the 1-2 line.

2. The coupler of claim 1, wherein the second coupling line is located to overlap at least a portion of the first coupling line.

3. The coupler of claim 1, wherein the internal ground pattern comprises a first ground pattern located between the ground electrodes and the first coupling line or between the ground electrodes and the second coupling line.

4. The coupler of claim 1, wherein the 1-4 line is formed to have a thicker width than that of the 1-2 line.

5. The coupler of claim 1, wherein at least a portion of the internal ground pattern is formed at a position not overlapping the first coupling line and the second coupling line so as to be able to induce interference between the first coupling line and the second coupling line.

6. The coupler of claim 1, wherein the coupler body further comprises:
   a first sheet comprising the ground electrodes and the port electrodes;
   a second sheet comprising a first internal ground pattern;
   a third sheet comprising the first coupling line;
   a fourth sheet comprising the second coupling line; and
   a fifth sheet comprising a second internal ground pattern.

7. A coupler comprising:
   a coupler body comprising ground electrodes and port electrodes for power connection to an outside on a lower surface;
   a first coupling line located inside the coupler body, electrically connected to at least one of the port electrodes, and having a spiral structure as a whole;
   a second coupling line located inside the coupler body, electrically connected to at least another one of the port electrodes, and having a shape corresponding to the first coupling line; and
   an internal ground pattern electrically connected to the ground electrodes,
   wherein the first coupling line comprises:
   a 1-1 line connected to the port electrode;
   a 1-2 line extending long in a first direction from the 1-1 line;
   a 1-3 line extending long in a second direction bent at a predetermined angle from the 1-2 line; and
   a 1-4 line extending long in a third direction bent at a predetermined angle from the 1-3 line,
   wherein the 1-4 line is formed to have a thicker width than that of the 1-2 line.

* * * * *